US006112399A

United States Patent [19]

Burnett et al.

[11] Patent Number: 6,112,399

[45] Date of Patent: Sep. 5, 2000

[54] MAGNETIC SEPARATOR HAVING AN IMPROVED SEPARATION CONTAINER CONFIGURATION FOR USE WITH A SUPERCONDUCTIVE ELECTROMAGNET

[75] Inventors: Sibley C. Burnett, Cardiff; L. Cullen Andrews, San Diego; Gregory S. Beck, Anaheim, all of Calif.; R. Lewis Creedon, Port Townsend, Wash.; John R. Purcell, San Diego, Calif.

[73] Assignee: Outokumpu OYJ, Espoo, Finland

[21] Appl. No.: 08/849,232

[22] PCT Filed: Sep. 26, 1996

[86] PCT No.: PCT/US96/15455

§ 371 Date: May 14, 1997

§ 102(e) Date: May 14, 1997

[87] PCT Pub. No.: WO97/11781

PCT Pub. Date: Apr. 3, 1997

Related U.S. Application Data

[60] Provisional application No. 60/004,355, Sep. 27, 1995.

[51] Int. Cl.[7] .......... H01L 39/24

[52] U.S. Cl. .......... 29/599; 29/605; 505/230; 505/917

[58] Field of Search .......... 29/599, 605, 606; 209/214, 223.1, 225, 226, 227, 231, 232, 636; 505/230, 917

[56] References Cited

U.S. PATENT DOCUMENTS

| | | | |
|---|---|---|---|
| 3,005,117 | 10/1961 | Buchhold | 310/40 |
| 3,133,144 | 5/1964 | Cottingham et al. | 174/15 |
| 3,360,692 | 12/1967 | Kafka | 317/123 |
| 3,503,504 | 3/1970 | Bannister | 209/223 |
| 4,033,864 | 7/1977 | Nolan et al. | 209/223 |
| 4,046,681 | 9/1977 | Marston et al. | 209/224 |
| 4,069,705 | 1/1978 | Burr et al. | 73/61 |
| 4,116,822 | 9/1978 | Webb | 209/11 |
| 4,124,503 | 11/1978 | Watson | 210/42 |
| 4,129,498 | 12/1978 | Clark et al. | 209/213 |
| 4,172,819 | 10/1979 | Mitchell et al. | 209/11 |
| 4,190,524 | 2/1980 | Watson | 209/213 |
| 4,272,365 | 6/1981 | Ries et al. | 209/223 |
| 4,298,478 | 11/1981 | Watson et al. | 210/695 |
| 4,609,109 | 9/1986 | Good | 209/636 |
| 4,668,383 | 5/1987 | Watson | 209/216 |
| 4,694,269 | 9/1987 | Burnett et al. | 29/599 X |
| 4,702,825 | 10/1987 | Selvaggi et al. | 209/224 |
| 4,707,676 | 11/1987 | Saitou et al. | 335/216 |
| 4,726,199 | 2/1988 | Takano et al. | 62/505 |
| 4,743,880 | 5/1988 | Breneman et al. | 335/301 |
| 4,755,302 | 7/1988 | Unkelbach et al. | 209/232 X |
| 4,768,008 | 8/1988 | Purcell et al. | 335/216 |
| 4,784,760 | 11/1988 | Good et al. | 209/223.1 |
| 4,819,450 | 4/1989 | Miller | 62/514 R |
| 4,822,772 | 4/1989 | Huson | 505/1 |
| 5,004,539 | 4/1991 | Colwell, Jr. | 209/232 X |
| 5,019,247 | 5/1991 | Purcell et al. | 209/224 |
| 5,148,137 | 9/1992 | Purcell et al. | 335/301 |
| 5,237,738 | 8/1993 | Purcell et al. | 29/599 |

FOREIGN PATENT DOCUMENTS

| | | | |
|---|---|---|---|
| 52-45777 | 4/1977 | Japan | 209/232 |
| 874191 | 10/1981 | U.S.S.R. | 209/232 |

*Primary Examiner*—Tuan N. Nguyen
*Attorney, Agent, or Firm*—Fitch, Even, Tabin & Flannery

[57] ABSTRACT

A method of designing and manufacturing a magnetic separation apparatus. Past separators generally had poor power efficiency, poor throughput performance, and/or were bulky. Designing the magnetic separator of the present invention involves selecting a diameter and height for a separation container and superconducting coil by optimizing at least one parameter from a group of parameters. The magnetic separation apparatus includes a superconducting electromagnet and separation container having a diameter of about 60 inches, a height of about 40 inches, an inlet port, an outlet port, and removable matrix modules. The electromagnet generates a magnetic field strength within the separation container of greater than 3 Tesla. The optimized separation container volume, the high magnetic field strength, and the matrix modules allow the magnetic separation apparatus to have greatly increased slurry processing capacity.

17 Claims, 6 Drawing Sheets

MAGNETIC SEPARATOR HAVING AN IMPROVED SEPARATION CONTAINER CONFIGURATION FOR USE WITH A SUPERCONDUCTIVE ELECTROMAGNET

This application claims priority to U.S. Application Ser. No. 60/004,355, filed Sep. 27, 1995 for MATERIAL SEPARATION EMPLOYING A SUPERCONDUCTIVE ELECTROMAGNET.

BACKGROUND OF THE INVENTION

The present invention relates to mineral separation, and more particularly, to the separation of paramagnetic minerals from nonmagnetic minerals using high gradient magnetic fields.

High gradient magnetic separators have been particularly useful in the kaolin clay industry. Kaolin clay is a nonmagnetic material that, when mined, contains traced quantities of paramagnetic impurities such as titanium dioxide ($TiO_2$) and iron oxide ($FeO_2$). The magnetic impurities are removed from the kaolin clay by mixing the clay with water to form a slurry. The slurry is then pumped through a separation container that is subjected to an intense magnetic field and packed with stainless steel wool. The intense magnetic field causes high magnetic field gradients to form around the fibers of the steel wool causing the paramagnetic impurities to be attracted to the steel wool. Over time, the stainless steel wool becomes saturated with a buildup of the paramagnetic impurities, reducing the effectiveness of the magnetic separator. Past developments in magnetic separators have focused on improving the efficiency of generating the magnetic field in the separation container and removing the paramagnetic impurity buildup.

Initially, conventional copper coils were used to generate the magnetic field for mineral separation. Unfortunately, copper coils have a finite resistance and, to maintain a high gradient magnetic field, must be continuously supplied with a large quantities of electrical power. More particularly, in a magnetic solenoid, typical of those used in a magnetic separator, the ampere-turns (NI) of the solenoid are proportional to the desired flux density (B) times the magnetic reluctance ($\mathfrak{R}$) of the solenoid. When an iron casing is used in the regions outside of the solenoid and the separation container and the magnetic field is below about 2 Tesla, most of the magnetic reluctance in the solenoid is caused by an air gap formed by the separation container. Also, magnetic reluctance is proportional to the size of the air gap (G) or, more specifically; the distance between the "pole" faces on the iron casing. An increase in the air gap results in an increase in the necessary current (I) and/or an increase in the number of coil turns (N) if a particular flux density is to be achieved.

The copper coil's resistance is proportional to the diameter of the coil times the number of turns (N). Since power (P) equals current (I) squared times resistance (R), the power required for a conventional copper coil is proportional to the desired magnetic flux density (B), times the gap (G), times the diameter (D), times the current (I). Thus, an increase in diameter in a conventional copper coil results in a directly proportional increase in power, and an advantageous volume increase proportional to the diameter squared. However, an increase in gap (G) results in a directly proportional power increase and a less advantageous, directly proportional volume increase. For these reasons, increasing the air gap in a copper-coil based separator required a large proportional increase in electrical power consumption and, for cost and efficiency reasons, generally was not considered a viable option.

These factors induced magnetic separators using conventional copper coils to be designed to use relatively flat, pancake-like, separation containers. Thus, existing copper coil based magnetic separators typically use a separation container having a diameter from about 213 centimeters (84 inches) to about 305 centimeters (120 inches) and a height of about 50 centimeters (20 inches). The 305 centimeter (120 inches) separation container diameter was considered an improvement over previous containers having a diameter of 84 inches. However, the increased diameter increased the separator's weight from about 226,800 kilograms (250 tons) to about 635,000 kilograms (700 tons). Magnetic saturation of the iron in the casing limited the magnetic field strength within the separation container to about 2 Tesla.

Efforts to reduce the power required to generate the magnetic field in the separation container resulted in the development of electromagnets using superconducting coils. These efforts were generally directed toward "drop in" replacements for existing copper coils, and thus most superconducting coils used in magnetic separators today have geometries substantially identical to the geometries of the copper coils they have replaced. A main advantage of using a superconducting coil in a magnetic separator is that a superconductor has virtually no resistance. Accordingly, once a current is induced in a superconducting coil, no or little additional electrical power is need to maintain the current.

When the stainless steel wool becomes saturated with a buildup of magnetic impurities, the current in the superconducting coil is periodically ramped down to permit flushing of the magnetic impurities from the stainless steel wool. Such flushing is achieved by flowing high pressure water and air through the separation container (in alternating forward and reverse directions). Following the flushing, the current in the superconducting coil is then ramped up again and the separation repeated. Ramping times can be, for example, in the order of 60 seconds.

Another approach for removing the buildup of magnetic impurities on the stainless steel wool involves periodically moving the entire separation container out of the magnetic field generated by the superconducting coil to permit flushing in the manner described above. In accordance with this approach, current within the superconducting coil remains constant, thus eliminating the need for ramping. In a sense, this approach represents a mechanical solution to an electromagnetic problem, i.e., removing the magnetic field from the separation container and the stainless steel wool prior to flushing. Unfortunately, however, the moving of the separation container necessitates the opening and closing of numerous valves and the capacity of such a device is limited by the necessity of moving a large canister in and out of the magnetic field.

Other magnetic separators exist that are generally used for experimental purposes. These separators typically have a long tubular separation container. However, these long tube separators have provided only modest performance increases and have limited capacity.

Accordingly, there exists a need for a magnetic separator having good power efficiency while providing superior throughput performance. The present invention satisfies this need.

SUMMARY OF THE INVENTION

The present invention advantageously addresses the needs above as well as other needs by providing an improved magnetic separation apparatus and method employing a superconducting electromagnet that can operate in pulsed mode.

In accordance with one aspect of the invention, a method is provided for designing and manufacturing a separation apparatus for separating a magnetic component from a non-magnetic component in a slurry. Such method involves the steps of designing a pulsed superconducting coil for begirding a separation container and for generating a magnetic field that passes through the separation container, and manufacturing the superconducting coil. The designing of the pulsed superconducting coil involves selecting a diameter for the superconducting coil, and selecting a height for the superconducting coil. The diameter and the height, in accordance with the present embodiment, are selected based on at least one parameter from a group of parameters. The group of parameters includes (1) maximizing the volumetric capacity of the separation container to process the slurry using a prescribed magnetic flux density, (2) minimizing the volume of an iron casing needed to at least partially envelop the pulsed superconducting coil and to provide a flux return path for the magnetic field for a prescribed separation container volume, (3) minimizing the footprint of the separation apparatus for a prescribed separation container volume and a prescribed magnetic flux density within the separation container, and/or (4) minimizing the magnetic field strength needed to achieve material separation at a prescribed rate in a prescribed separation container volume. In one aspect of the invention, the diameter and the height are selected based on all four parameters in the group of parameters.

As used herein, the term "begirding", or alternate forms thereof, refers to a relationship between the superconducting coil and at least a portion of the separation container in which the portion of the separation container is enveloped within a space defined by the superconducting coil. The space is defined as that region within the center of the coil, i.e., a roughly cylindrical region within the coil having a height near that of the coil and a diameter equal to the inner diameter of the coil.

In accordance with another aspect of the invention, an optimized method of manufacturing the superconducting magnetic separation apparatus is provided that includes the steps of selecting a desired treatment volume for a separation container; and designing a superconducting coil for begirding at least a portion of the separation container and for generating a magnetic field that passes through the separation container. The designing of the superconducting coil involves the steps of selecting an inner diameter for the superconducting coil of from between 50 centimeters and 250 centimeters, e.g., about 152 centimeters (60 inches); and selecting a height for the superconducting coil of from between 75 centimeters and 250 centimeters, e.g., about 102 centimeters (40 inches). The selecting of the diameter and the selecting of the height, should be such that the superconductive coil can accommodate the desired treatment volume within the portion of the separation container that is to be begirded by the superconducting coil. The method also involves the steps of manufacturing the separation container with the desired treatment volume; and manufacturing the superconducting coil with the selected diameter and height.

A further aspect of the invention provides an improved apparatus for separating a nonmagnetic component from a magnetic component in a slurry. The apparatus is made up of a superconducting coil and a separation container positioned relative to the coil so that a magnetic field emanating from the coil passes through a volume of the separation container. The separation container has an inlet port, a pressure vessel coupled to the inlet port, and an outlet port coupled to the pressure vessel. The volume of the separation container has a diameter of from between 50 centimeters and 250 centimeters, a height of from between 75 centimeters and 250 centimeters, and a diameter-to-height ratio between 3:1 and 1:2. In a specific embodiment, the volume's diameter is 60 inches (152.4 centimeters), the volume's height is 40 inches (101.6 centimeters), and the magnetic field strength within the volume is greater than 2 Tesla.

Yet another aspect of the invention provides superconducting magnetic separator apparatus having a pulsed coil; a separation container positioned relative to the pulsed coil so that a magnetic field emanating from the pulsed coil, in response to a current passing through the pulsed coil, passes through the separation container; a plurality of separation matrix modules positioned within the separation container; and a plurality of seals positioned between at least two of the plurality of matrix modules so as to direct a flow of the slurry through several of the plurality of matrix modules as its flows through the separation container.

The term "matrix module" as used herein refers preferably to a modular container packed with steel wool and having an inlet and an outlet, each matrix module including a mesh screen, a perforated wall or the like. Numerous styles and variations of "matrix modules" are contemplated within the scope of the present invention in addition to the specific embodiments of the matrix modules disclosed herein.

The term "pulsed coil" as used herein refers to a coil in which current is removed during flushing of the separation container and then restarted following flushing. For example, the current can be ramped down prior to flushing and ramped back up after flushing.

The matrix module aspect of the present invention is advantageous for at least two reasons: (1) because the paramagnetic impurities tend to accumulate to the first available "clean" steel wool fibers in the matrix, most of the separation occurs incrementally through the matrix's height and passing the slurry through a matrix of a height greater than several centimeters merely passes impure clay through steel wool already having accumulated impurities or passes clean clay through "clean" steel wool and may not provide an advantage to the user of the material separation apparatus; (2) because more "surface area" is available for the slurry to pass into and out of the matrix than would be available if the matrix simply filled the embodiment container, more slurry can be processed using the matrix module aspect of the present invention than with a design in which the matrix simply filled the separation container.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENTS

The following description of the presently contemplated best mode of practicing the invention is not to be taken in a limiting sense, but is made merely for the purpose of describing the general principles of the invention.

Figure 1:
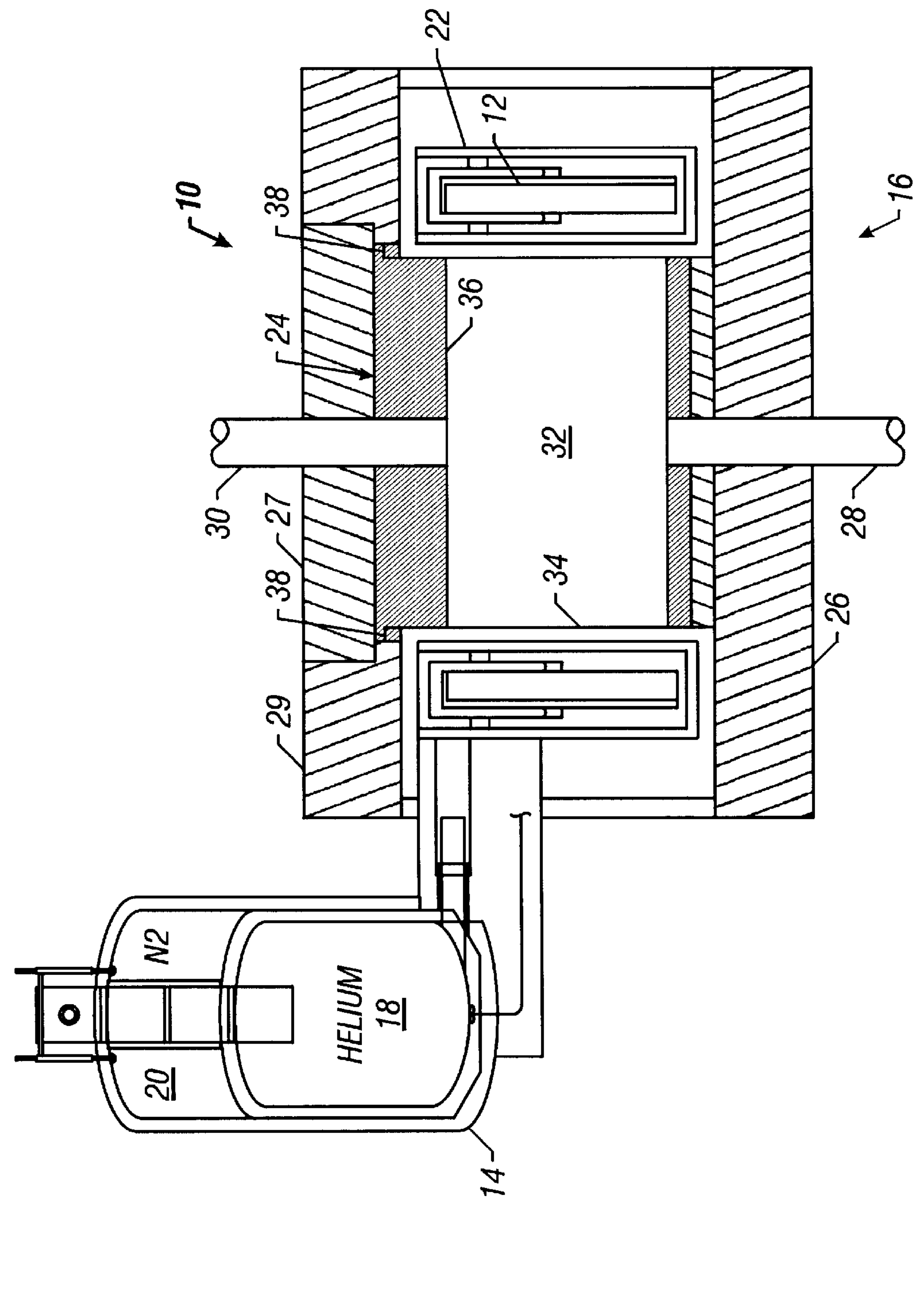
FIG. 1 is a cross-sectional side view of an improved magnetic separation apparatus employing a. superconductive electromagnet and having an improved separation container configuration, in accordance with an embodiment of the present invention.

Referring first to FIG. 1, a cross-sectional side view is shown of a magnetic separation apparatus 10 employing a superconducting coil 12 and having an improved separation container 24 configuration. The magnetic separation apparatus 10 further includes a service module 14 for cooling the superconducting coil 12. The superconducting coil 12 and separation container 24 are integrated within a separation unit 16. The separation unit 16 includes a cryostat 22 for thermally insulating the cooled superconducting coil 12 from ambient temperatures. The cryostat 22 is configured in accordance with similar vessels described in U.S. Pat. Nos. 5,019,247; 5,148,137; and 5,237,738 (Purcell, et al.), all of which are hereby incorporated herein by reference.

The near-zero power consumption of the superconducting coil 12 allows the coil to have the height or width dimensions necessary to fill a desired separation container volume with an advantageous magnetic field strength, e.g., 3 Tesla. Thus, the dimensions of the superconducting coil are largely defined by the desired separation container configuration, discussed below. The superconducting coil operates in a "pulsed" current mode as described in the patents referenced above.

The interior of the separation container 24 advantageously has a 152 centimeter (60 inch) diameter and a 102 centimeter (40 inch) height. It has been found that the long tubular separation containers of the prior art, see e.g., U.S. Pat. No. 4,702,825, neglected to take into consideration the flow area of the ferromagnetic matrix or steel wool in the separation container. More specifically, the throughput of a magnetic separator is equal to the flow area times the magnetic field times the duty cycle. Because of the reduced flow area in a long tubular separation container, the cycle time between backwashes is substantially less than desired. The container configuration of the present invention represents an optimization of the tradeoffs between cycling time between backwashes, magnetic field strength, and apparatus size and weight.

The separation container 24 employs an inlet port 28, an outlet port 30, and a pressure vessel 32. The pressure vessel 32 includes a vessel body 34, and a lid 36. The lid 36 is sealed to the vessel body 34 using a large O-ring seal 38, which provides seal integrity up to about 100 pounds per square inch. The lid 36 is held onto the vessel body 34 in a conventional manner using bolts (not shown).

The flux return path is employed using an iron casing 26, which surrounds both the superconducting coil 12 and the separation container 24. The iron casing 26 is preferably made from 1004 to 1020 carbon steel (low carbon steel). Preferably, the iron casing 26 resides physically below, above, and to the sides of the superconducting coil 12 and the separation container 24. The iron casing 26 has a thickness of approximately 20 inches (51 centimeters) both above and below the separation container 24 and the superconducting coil 12. To the sides of the superconducting coil 12 and separation container 24, the iron casing occupies "corner" regions of a square cross-section of the portions of the iron casing that are above and below the superconducting coil 12 and separation container 24. The iron casing 26 is preferably square in shape, as viewed from above or below, (but could also be, for example, circular) and a section 27 of the portion 29 of the iron casing 26 residing above the separation container 24 is preferably removable from a remainder of such portion so that the separation container 24 can be easily accessed during maintenance operations.

Note that the removable section 27 of the portion 29 of the iron casing 26 that resides above the separation container 24 and superconducting coil 12 does not need to be bolted to, or otherwise fastened to the remainder of such portion, because the intense magnetic field generated when current flows through the superconducting coil 12 is of sufficient flux density to hold the section tightly in place during operation of the material separation unit 10. Advantageously, such lack of bolts or other fasteners makes accessing the separation container 24 during maintenance (such as replacement, alteration or repair of the contents of the separation container 24) easier and quicker because once the current in the superconducting coil has been ramped down, the portion of the iron casing 26 that resides above the separation container 24 can be easily removed (in the absence of the magnetic field). For example, a high brightness clay advantageously may be separated by a matrix of relatively fine steel wool, whereas a commodity clay may be advantageously separated by a matrix of relatively course steel wool. The use of a removable section 27 advantageously reduces the time required for changing the matrix configuration from nearly a day down to about one hour.

The service module 14 employs two large tanks, such as are known in the art. A first tank 18 is used to contain liquid helium, and a second tank 20 is used to contain liquid nitrogen. The liquid helium contained within the first tank 18 is used to cool the superconducting coil 12 within the materials separation unit 16 to approximately 4° K., in order to achieve superconductivity within the coil. The liquid nitrogen contained within the second tank 20 is used to cool a radiation intercepting shield that envelopes the superconducting coil. The service module 14 also couples to a power supply unit (not shown) that is used to ramp the current down and up in the superconducting coil 12 prior to and subsequent to servicing (e.g., flushing) of the materials separation unit 16. In a preferred configuration, the overall dimensions for the iron casing 26 are a width and depth of 3.2 meters and a height of 2.4 meters. Preferred dimensions for the superconducting coil 12 are a height of about 110 centimeters and a diameter of about 160 centimeters. Preferred dimensions for the interior of the separation container are a diameter of 152.4 centimeters (60 inches) and a height of 101.6 centimeters (40 inches). The dimensions given here can be vary over a wide range without departing from the present invention. It is considered that a diameter-to-height ratio between 3:1 and 1:2 may achieve many of objects and principles of the present invention.

A major advantage of using a superconducting coil is that no power is required to generate the magnetic field because resistance in the coil is zero, or very close to zero. In addition, current used to charge the superconducting coil when it is ramped up is preferably returned to the electrical power supply (grid) when the superconducting coil is ramped down. Thus, the zero or near zero power consumption of the superconducting coil 12 eliminates the heretofore predominate design consideration of power efficiency (because the unit is power efficient regardless of the geometry of its superconducting coil) and therefore makes the above superconducting coil 18, cryostat 22 and separation container dimensions commercially viable.

The reduced overall diameter of the superconducting coil 12 as compared to the diameter in conventionally sized copper coils, results in a smaller, lighter and more manageable coil, which in turn results in a smaller overall footprint for the material separation apparatus 10. This smaller footprint means that less space is required for the magnetic separation apparatus 10, and a smaller (and less expensive) iron casing can be used. The increased height of the superconducting coil 12, as compared to the height of conventionally-sized copper coils, allows the separation container 24 to have approximately the same volume as separation containers used with conventional copper coils. Because the superconducting coil 12 is used, as opposed to a conventional copper coil, such increased height (or gap) does not increase the power required to generate a magnetic field of commercially sufficient flux density. Thus, the enormous advantages of a smaller overall footprint are achieved without sacrificing volume in the separation container, the capacity of the separation system, and power economy.

Advantageously, the magnetic field generated within the separation container, which may, for example, have a magnetic flux density of from 2 to 5 Tesla, is of greater flux density than the magnetic field generated in the separation containers of conventional material separation apparatuses, which generally have a magnetic flux density of less than 2 Tesla. As a result, not only can the same volume of material be processed by the present embodiment as with conventional high gradient magnetic separation (HGMS) systems, due to the separation container 24 having approximately the same volume as conventional separation containers, but the rate at which material can be passed through the separation container 24 can be greater than in conventional systems due to this increased magnetic flux density.

Figure 2:
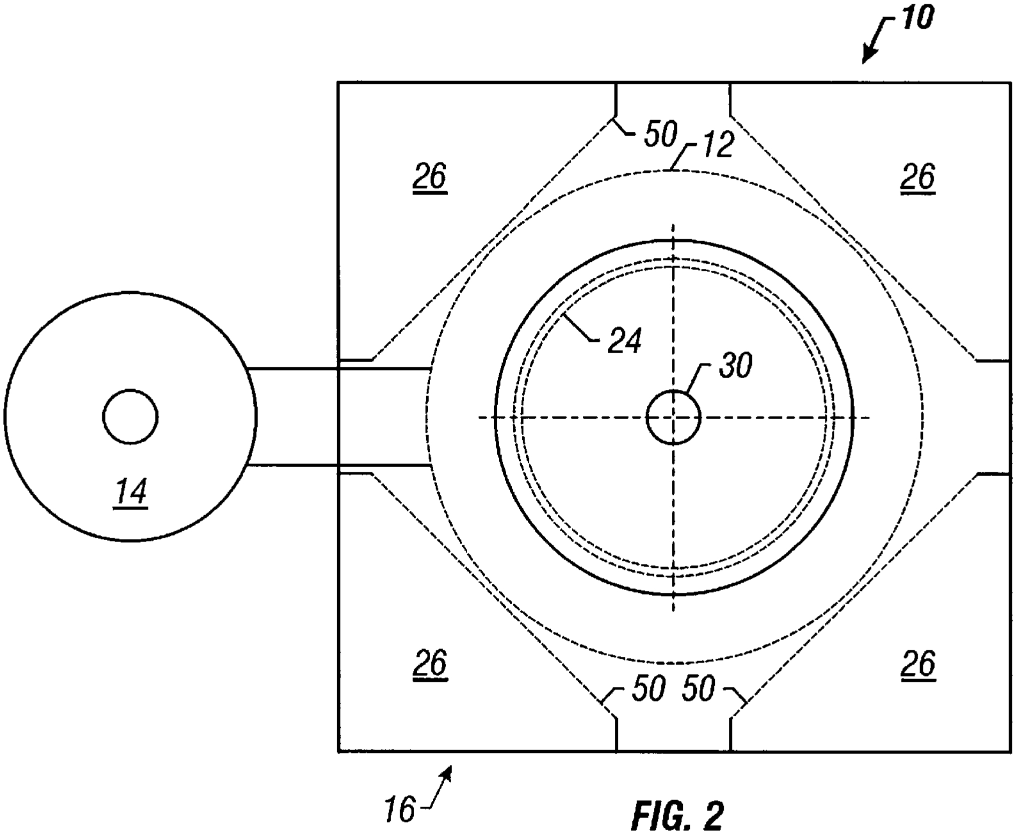
FIG. 2 is a cross-sectional-top view of the magnetic separation apparatus of FIG. 1.

Referring next to FIG. 2, a cross-sectional top view of the material separation apparatus 10 is shown.

The service module 14, and the material separation unit 16 are shown with the iron casing 26 covering the superconducting coil 12 and the separation container 24. Ghost lines depict the location of the cryostat 22, the separation container 24, and corner portions 50 of the iron casing 26 (which are not shown in FIG. 1.). As can be seen, the iron casing 26 has an approximately square cross-section, when viewed from above, and the corner portions 50 are roughly triangular in cross-section, when viewed from above, occupying corner spaces of the square cross-section of the iron casing 26. The iron casing 26 provides a superior magnetic flux return path for magnetic flux emanating from the superconducting coil 12.

Figure 3:
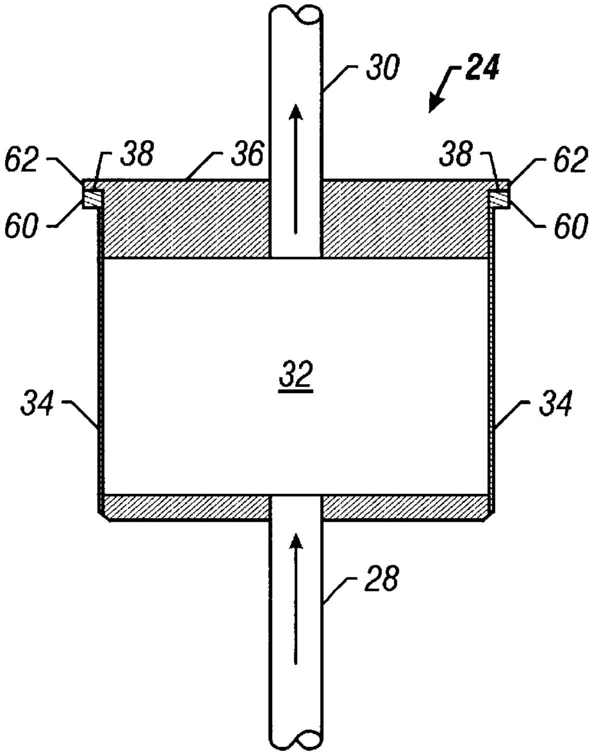
FIG. 3 is a cross-sectional view of a separation container that may be employed in the magnetic separation apparatus of FIGS. 1 and 2.

Referring next to FIG. 3, a cross-sectional view is shown of the separation container 24 employed in the material separation apparatus 10. A separation container 24 employs the pressure vessel 32, the inlet port 28 and the outlet port 30. The pressure vessel 32 utilizes the vessel body 34 and the lid 36. In operation, the lid 36 is placed onto the vessel body 34 and rests against a lip 60 of the vessel body 34 at a flange 62, which is at the periphery of the lid 36. Between the lip 60 of the vessel body 34, and the flange 62 of the lid 36, an O-ring seal 38 is interposed so as to form a tight seal between the lid 36 and the vessel body 34. The formation of the tight seal is facilitated by the bolts that hold the lid 36 in place on the vessel body 34. This tight seal, preferably, is able to withstand, e.g., 100 pounds per square inch of pressure so as to prevent the contents of the pressure vessel 32 from escaping during operation.

Figure 4:
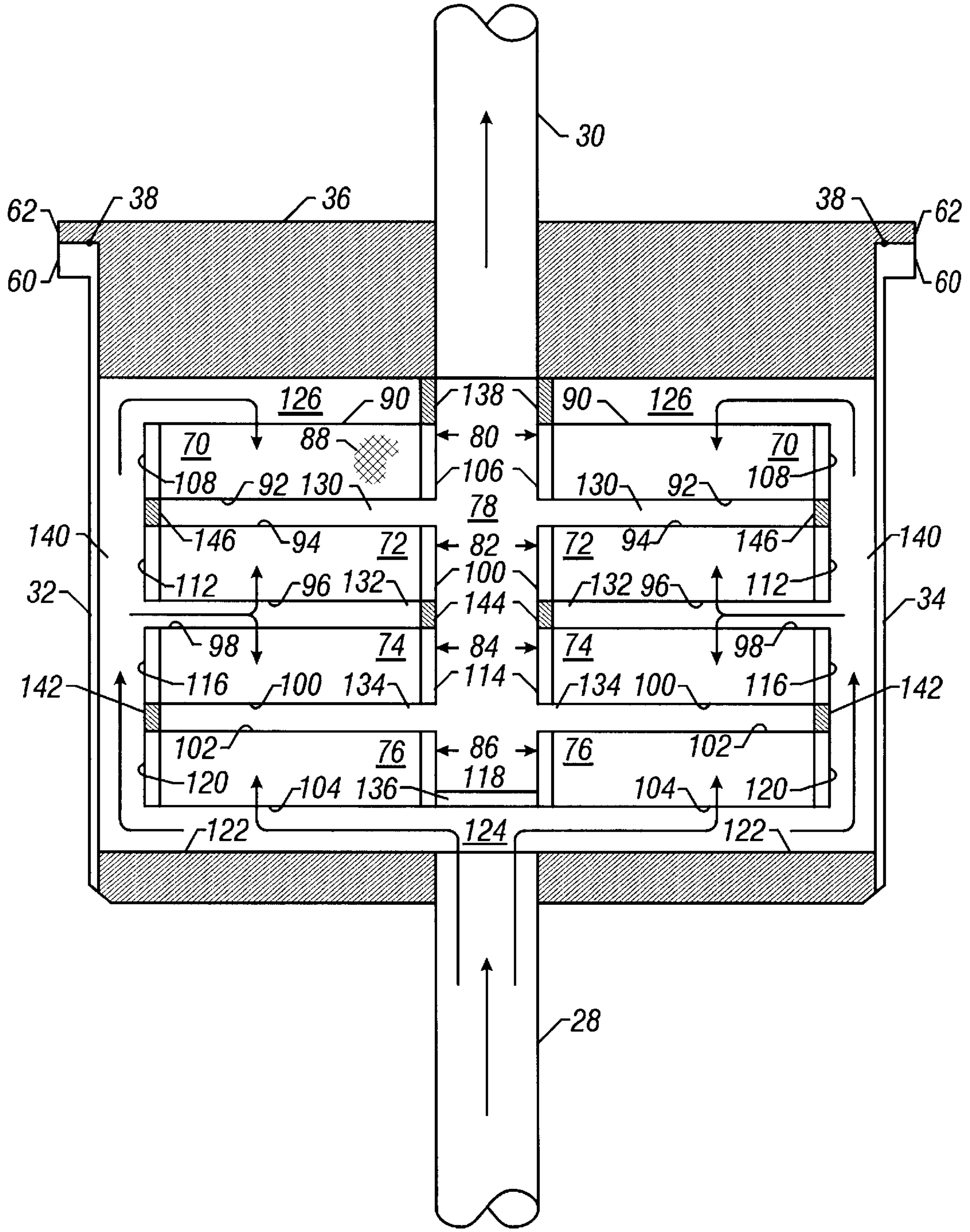
FIG. 4 is a cross-sectional view of a single pass configuration of the separation container of FIG. 3 employing a plurality of matrix modules configured in a parallel path.

Referring next to FIG. 4, a cross-sectional view is shown of one variation of the separation container 24 or canister employing a plurality of matrix modules 70, 72, 74, 76. The separation container 24 is shown, including the inlet port 28, the outlet port 30, and the pressure vessel 32. The vessel body 34, the lid 36 and the O-ring seal 38 are shown, with the flange 62 of the lid 36 seated against the edge 64 of the vessel body 34, with the O-ring seal 38 interposed thereinbetween. Within the cavity defined by the lid 36 and the vessel body 34, an array of matrix modules 70, 72, 74, 76 is positioned. The matrix modules 70, 72, 74, 76 are preferably toroidal in shape with a cylindrical cavity defined by the center region of each toroid. The matrix modules 70, 72, 74, 76 are stacked within the vessel body 34 such that the cylindrical cavities of each toroid are coaxial, thereby forming a central passage 78 within the vessel body 34.

In the variation shown, four matrix modules 70, 72, 74, 76 are stacked within the vessel body 34. Each matrix module 70, 72, 74, 76 employs a housing 80, 82, 84, 86 that contains a matrix of ferromagnetic (400 series) stainless steel wool 88 (a portion which is depicted in the uppermost matrix module 70). The stainless steel wool 88 is made from steel wool formed as a mass of thin tangled wires having a diameter of 10 to 100 micrometers, e.g., 50 micrometers, and a volumetric density within the matrix modules 70, 72, 74, 76 of 3 to 15 percent, e.g., 6 percent.

The housings 80, 82, 84, 86 of the matrix modules 70, 72, 74, 76 employ a screen mesh 90, 92, 94, 96, 98, 100, 102, 104 (or perforated region) on the ends of the torodial shape of the matrix modules 70, 72, 74, 76 (i.e., on the tops and bottoms of the matrix modules 70, 72, 74, 76 as oriented in FIG. 4), while the inner and outer circumferences 106, 108, 110, 112, 114, 116, 118 120 of such torodial shape consist of solid sheets of material, e.g., stainless steel. In this way, the housings 80, 82, 84, 86 allow fluid materials, such as a slurry of water and kaolin clay, or plain water (which is used to periodically flush the matrix) to pass through the matrix modules 70, 72, 74, 78 in roughly only two directions, i.e., parallel to the central axis of the central passage, or anti-parallel to such central axis. (Examples of other applications in which the present embodiment could be employed include removing iron oxide ($FeO_2$) from ground calcium carbonate or bauxite (raw aluminum); removing pyrite from coal; and removing actinides (a radioactive mineral) from water. Fluid materials are prevented from flowing radially by the solid sheets of material that form the inner and outer circumferential surfaces 106, 108, 110, 112, 114, 116, 118, 120 of the housings 80, 82, 84, 86.

When the matrix modules 70, 72, 74, 76 are stacked within the vessel body 34, a small space 124 of, e.g., 8 centimeters, is left between the bottom surface 122 of the vessel body 34 and the bottom-most matrix module 76 by placing spacer elements (not shown) beneath the bottom-most matrix module 76. Similarly, a small space 126, e.g., 8 centimeters, is left between the lid 36 and the uppermost matrix module 70. Furthermore, spaces 130, 132, 134 of, e.g., 5 centimeters are left between each of the matrix modules 70, 72, 74, 76 by placing suitable spacer elements (not shown) between each of the matrix modules 70, 72, 74, 76.

As mentioned above, the cylindrical cavities formed within each of the toroidal shapes of the matrix modules 70, 72, 74, 76 combine to form the central passage 78 (or cavity) at the center of the pressure vessel 32. This central passage 78 (or cavity) is aligned with, and has a radius approximately equal to, a radius of the inlet port 28, and the outlet port 30. One end of the central cavity (the lower end, as depicted in FIG. 4) is closed off using a blocking element 136, which preferably employs a plug or sheet, which is fastened to the lower edge of the inner circumferential surface 118 of the housing 86 of the bottom-most matrix module 76, so to prevent fluid from flowing directly from the inlet port 28 through the central cavity 78 to the outlet port 30. To this same end, a sealing element 138 is placed between the upper edge of the inner circumferential surface 106 of the housing 80 of the upper-most matrix module 70 and the opening of the outlet port 30 in the lid, so as to prevent fluid from flowing over the top of the upper-most matrix module 70 from a space 140 at the periphery of the matrix modules 70, 72, 74, 76 to which fluid is directed by the blocking element 136.

A sealing element 142 is also placed between the upper edge of the outer circumferential surface 120 of the bottom-most matrix module 76 and the bottom edge of the outer circumferential surface 116 of the next 30 matrix module 74 stacked within the vessel body 34. This sealing element 142 prevents fluid within the peripheral space 140 from flowing into the space 134 between the bottom-most matrix module 76 and the next matrix module 74 stacked thereabove, while allowing fluid to flow from this space 134 into central cavity 78.

An additional sealing element 144 is placed between the upper edge of the inner circumferential surface 114 of the housing 84 of this next matrix module 74 and a bottom edge of the inner circumferential surface 110 of the matrix module 72 immediately thereabove. This sealing element 144 allows fluid to flow from the peripheral space 140 into the space 132 between these two matrix modules 72, 74, but not from the space 132 between these two matrix modules 72, 74 into the central cavity 78.

A further sealing element 146 is placed between the lower edge of the outer circumferential surface 108 of the housing of the upper-most matrix module 70 and an upper edge of the outer circumferential surface 112 of the matrix module 72 immediately therebelow. This sealing element 146 prevents fluid from flowing from the peripheral space 140 into the space 130 between the upper-most matrix module 70 and the matrix module 72 immediately therebelow, while allowing fluid to flow from this space 130 into the central cavity 78.

In this way, and as can be seen as depicted by large arrows in FIG. 4, fluid is thus able to flow in through the inlet port 28, to the space 124 below the bottom-most matrix module 76. Then the fluid is able to flow into the peripheral space 140, or into the bottom-most matrix module 76 through the mesh screen 104 (or perforations) on the bottom surface thereof.

From the peripheral space 140, fluid may flow into the space between the two center-most matrix modules 72, 74 and into the space 126 above the upper most matrix module 70. From the space between the two center-most matrix modules 72, 74, fluid may then flow into the two center-most matrix modules 72, 74 through the mesh screens 96, 98 (or perforations) at the respective upper and lower surfaces thereof.

From the space 126 above the upper-most matrix module 70, fluid is able to flow into the upper-most matrix module 70 through the mesh screen 90 (or perforations) on the top surface thereof.

Fluid may flow into the central cavity 78 from the space 134 between the bottom-most matrix module 76 and the matrix module 74 immediately thereabove through the mesh screens 102, 100 (or perforations) at the respective upper and lower surfaces of these matrix modules 76, 74. Similarly, fluid may flow into the central cavity 78 from the space 130 between the upper-most matrix module 70 and the matrix module 72 immediately therebelow through the respective mesh screens 92, 94 (or perforations) at lower and upper surfaces of these matrix modules 70, 72. Once in the central cavity 78, fluid may then flow into the outlet port 30. The spaces 122, 124, 126, 130, 132 and 134 are chosen so that the pressure drops through the spaces are low when compared to the pressure drops through the matrix modules 70, 72, 74, 76.

In this way, the above-described arrangement of matrix modules, sealing elements, and blocking elements, force the fluid flowing into the pressure vessel 32 to pass through the matrix (i.e., stainless steel wool) within exactly one of the matrix modules 70, 72, 74, 76 before flowing out through the outlet port 30, while at the same time not forcing the fluid to flow through multiple matrix modules, which in certain applications, may be of little or no value.

Advantageously, when used with the separation container 24 of the present embodiment, the above-described arrangement makes efficient use of the entire volume of the separation container 24. Specifically, by providing multiple flow paths for the kaolin slurry, each of which requires the slurry to pass through a prescribed volume of stainless steel wool matrix, the present embodiment assures that all of the slurry passes through the prescribed volume of stainless steel matrix, but does not require that the slurry pass through a matrix having a height equal to or close to the height of the separation container 24. This is advantageous for at least two reasons: (1) because the paramagnetic impurities tend to accumulate to the first available "clean" steel wool fibers, most of the separation occurs incrementally through the matrix's height and passing the slurry through a matrix of a height greater than several centimeters merely passes impure clay through steel wool already having accumulated impurities or passes clean clay through "clean" steel wool and may not provide an advantage to the user of the material separation apparatus; (2) because more "surface area" is available for the slurry to pass into and out of the matrix than would be available if the matrix simply filled the separation container, more slurry can be processed with the present embodiment than with a design in which the matrix simply filled the separation container 24. In those instances where greater matrix height is needed, the embodiment of FIG. 4 can easily and quickly be adjusted to the arrangement of FIG. 5.

Figure 5:
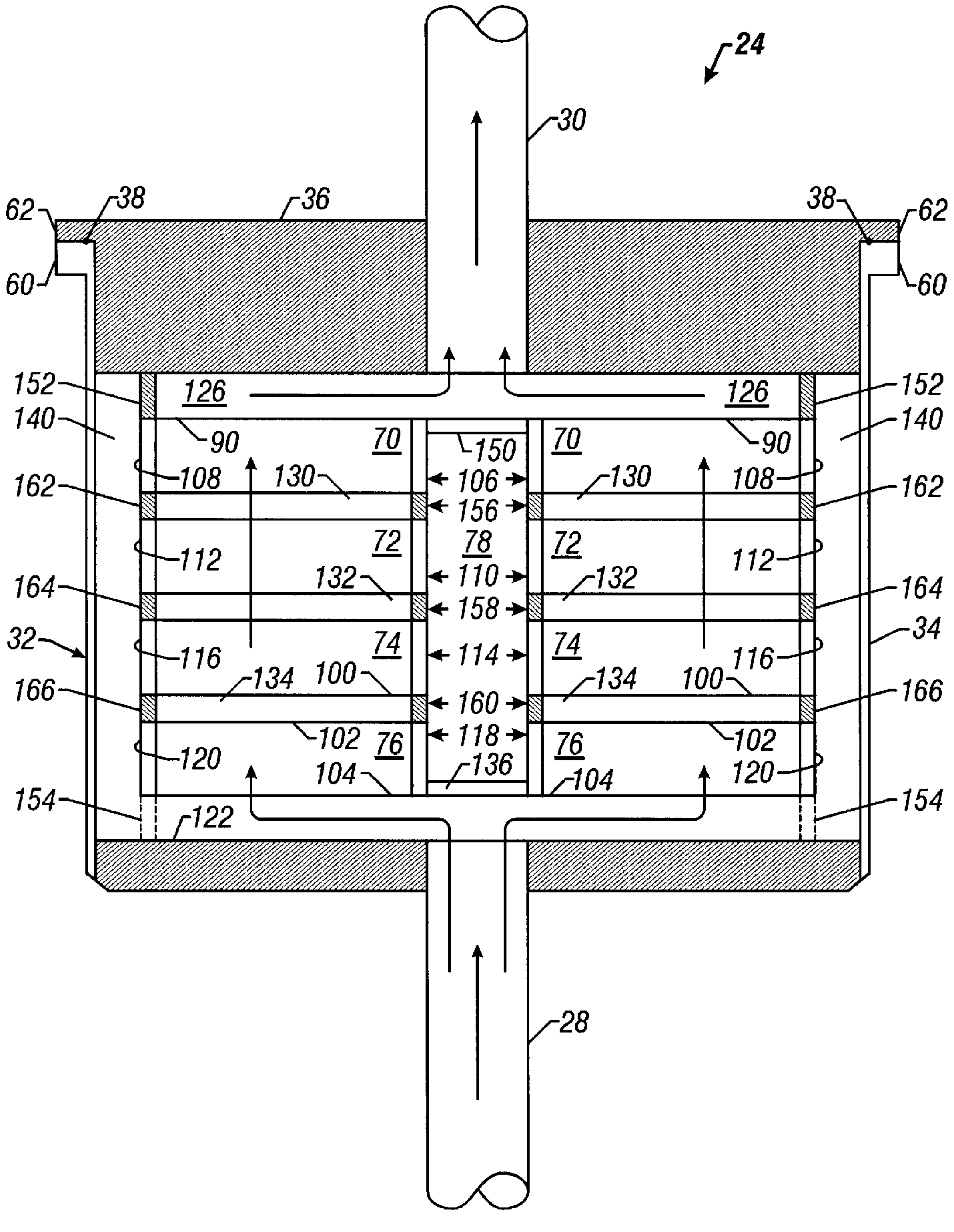
FIG. 5 is a cross-sectional view of a multiple pass configuration variation of the separation container of FIG. 3, employing the plurality of matrix modules configured in a single path.

Referring next to FIG. 5, a cross-sectional view is shown of another variation of the separation container 24 or canister also employing the plurality of matrix modules 70, 72, 74, 76. The separation container 24 includes the inlet port 28, the outlet port 30, and the pressure vessel 32. The pressure vessel 32 is made up of the vessel body 34, and the lid 36, which is sealed at the flange 62 of the lid 36 to the edge 60 of the vessel body 34 with the O-ring seal 38 and the bolts that hold the lid 36 to the vessel body 34.

Within the cavity formed within the vessel body 34 beneath the lid 36, a plurality of the torodially-shaped matrix modules 70, 72, 74, 76 are stacked, as in FIG. 4. In FIG. 5, however, the matrix modules 70, 72, 74, 76 are configured to direct the fluid serially through each of the matrix modules 70, 72, 74, 76 before exiting through the outlet port 30.

In order to achieve this configuration, the blocking member 136 is employed between the lower edges of the inner circumferential surfaces 118 of the bottom-most matrix module 76, and another blocking member 150 is employed between the upper edges of the inner circumferential surfaces 106 of the upper-most matrix module 70. A sealing element 152, similar to the sealing element 138 (FIG. 4) employed in the variation of FIG. 4 at the opening of the outlet port 30 on the lid 36, is employed between the lid 36 and the upper edges of the outer circumferential surface 108 of the upper-most matrix module 70. A similar sealing element 154 can be employed between the lower edges of the outer circumferential surface 120 of the bottom-most matrix module 76 and the floor 122 of the vessel body 34. Sealing elements 156, 158, 160, 162, 164, 166 are also employed between each of the matrix modules 70, 72, 74, 76 between respective upper and lower edges of both the inner and outer circumferential surfaces 106, 108, 110, 112, 114, 116, 118, 120 of each of the matrix modules 70, 72, 74, 78.

This arrangement prevents fluid from flowing into the peripheral region 140 between the inner walls of the vessel body 34 and the outer circumferential surfaces 108, 112, 116, 120 of the matrix modules 70, 72, 74, 76, and further prevents fluid from flowing into the central cavity 78 formed by the center regions of the matrix modules 70, 72, 74, 76 within the inner-most circumferential surfaces 106, 110, 114, 118 thereof. Thus, fluid can only flow from the inlet port 28 through the mesh screen 104 (or perforations) at the lower surface of the bottom-most matrix module 76, through the matrix (stainless steel wool) in the bottom-most matrix module 76, out the screen mesh 102 (or perforations) at the upper surface of the bottom-most matrix module 76, through the space 134 between the bottom-most matrix module 76 and the next matrix module 74 and into the screen mesh 100 (or perforations) at the lower surface of the next matrix module 74. The fluid progresses through each of the matrix modules 70, 72, 74, 76 in this manner until it emerges from the screen mesh 90 (or perforations) at the upper surface of the upper-most matrix module 70 into the space 126 between the upper-most matrix module 70 and the lid 36. The fluid then flows between the upper-most matrix module 70 and the lid 36 to the opening of the outlet port 30, and out the outlet port 30.

Thus, in this configuration, the fluid is forced to flow serially through each of the matrix modules, such as might be desirable, in order to obtain a particularly effective material separation, e.g., as might be needed when seeking to obtain a particularly high grade (e.g., high brightness) of kaolin clay. Advantageously, the sealing elements 152, 154, 156, 158, 160, 164, 166, 168, 170 (and, from FIG. 4, 138, 142, 144, 146) used to seal the edges of the matrix modules 70, 72, 74, 76 to adjacent edges of other matrix modules 70, 72, 74, 76 or to the bottom-most surface 122 of the vessel body 34, or to the bottom surface of the lid 36, may be added to or removed from the array of matrix modules 70, 72, 74, 76 in order to achieve a fluid flow pattern desired for a particular application (mere examples of which are shown in FIGS. 4 and 5). Also, these sealing elements 152, 154, 156, 158, 160, 164, 166, 168, 170 (and, from FIG. 4, 138, 142, 144, 146) need not, in all arrangements, be "high pressure" sealing elements, such as the O-ring seal 38, but rather can, advantageously, be "low pressure" sealing elements able to withstand only a few pounds of pressure per square inch. It is not critical that these sealing elements 152, 154, 156, 158, 160, 164, 166, 168, 170 (and, from FIG. 4, 138, 142, 144, 146) maintain a seal during flushing of the separation container 24, i.e., it is acceptable if these sealing elements 152, 154, 156, 158, 160, 164, 166, 168, 170 (and, from FIG. 4, 138, 142, 144, 146) "bleed" during flushing. A seal only need be maintained, in accordance with the present embodiment, during processing of, e.g., kaolin clay.

Figure 6:
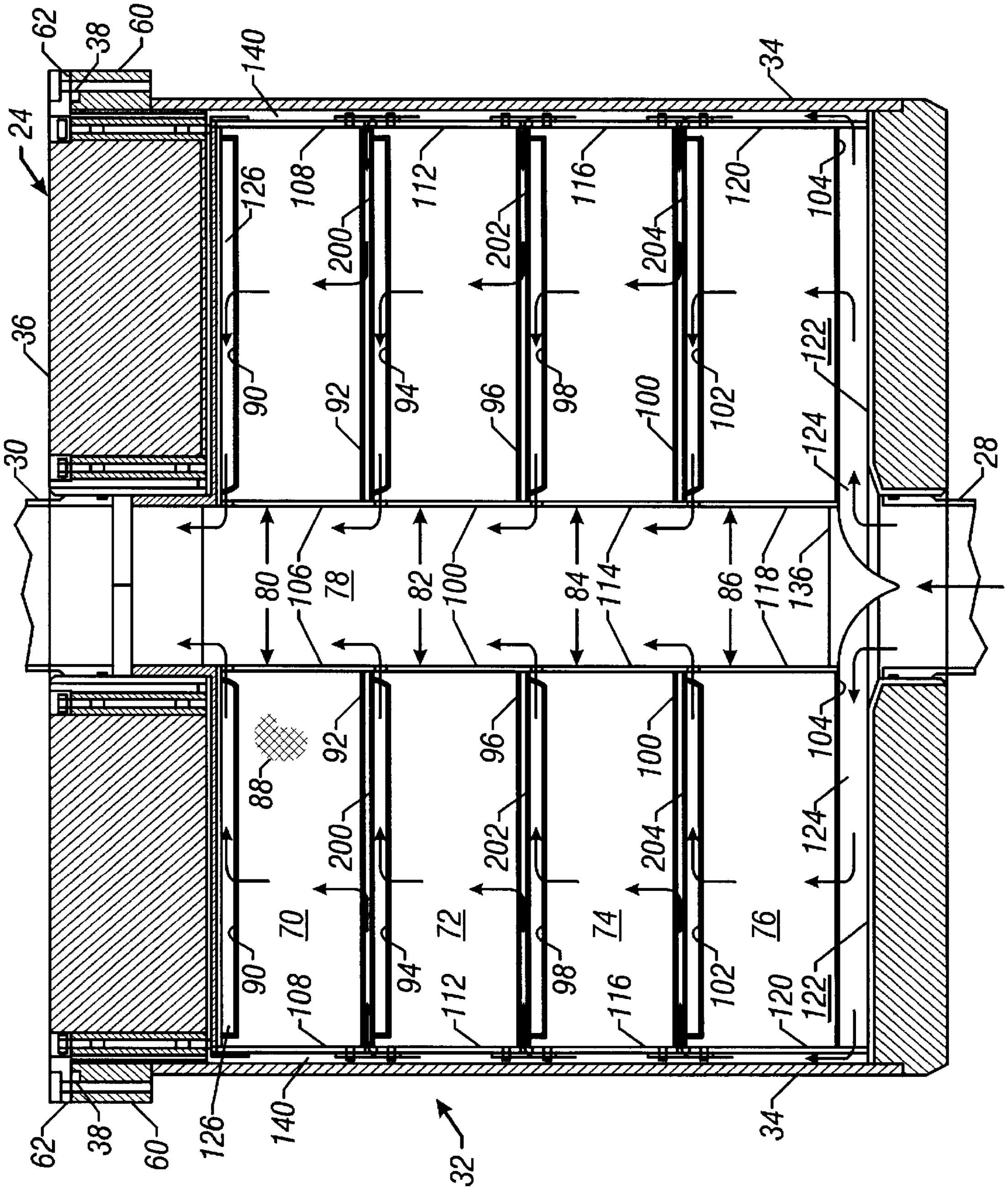
FIG. 6 is a more detailed, cross-sectional view of another variation of the separation container of FIG. 3 that may be employed in the magnetic separation apparatus of FIGS. 1 and 2.

Referring next to FIG. 6, a cross-sectional view is shown of a alternate separation chamber 24 or canister that may be employed in the material separation apparatus 10 of FIGS 1 and 2. The depicted separation container 24 employs the plurality of matrix modules 70, 72, 74, 76. The separation container 24 includes the inlet port 28, the outlet port 30 and the pressure vessel 32. The pressure vessel 32 is made up of the vessel body 34 and the lid 36, which is sealed at the flange 62 of the lid 36 to the edge 60 of the vessel body 34 with the O-ring seal 38 and the bolts that hold the lid 36 to the vessel body 34. Within the cavity formed within the vessel body 34 beneath the lid 36, a plurality of the torodially-shaped matrix module 70, 72, 74, 76 are stacked, as in FIGS 4 and 5. In FIG. 6, the matrix modules 70, 72, 74, 76 are configured to direct the fluid flow in parallel through plenums in each of the matrix modules 70, 72, 74, 76 before exiting through the outlet port 30, such as in FIG. 4. Unlike the embodiment of FIG. 4, however, the present embodiment is adapted to cause the fluid to flow upwardly, as oriented in FIG. 6, within each of the matrix modules 70, 72, 74, 76. This upward flow is achieved by interposing solid baffle plates 200, 202, 204 between each matrix module 70, 72, 74, 76 and the matrix modules 70, 72, 74, 76 adjacent to it. The blocking member 136 is employed between the lower edges of the inner circumferential surfaces 118 of the bottom-most matrix module 76. A sealing element is employed between the upper edges of the outer circumferential surfaces 108, 112, 116, 120 of the matrix modules 72, 74, 76, and the respective baffle plates 200, 202, 204, and a similar sealing element is employed between the lower edges of the inner circumferential surfaces 100, 106, 114, 118 of each of the matrix modules 70, 72, 74 and the respective baffle plates 200, 202, 204, such that fluid, e.g., kaolin slurry, cannot flow from the peripheral region 140 into the spaces between the respective baffle plates 200, 202, 204 and the upper mesh screens of the matrix modules, and further cannot flow from the central cavity into the spaces between the respective baffle plates 200, 202, 204 and the lower mesh screens of the matrix modules 72, 74, 76. Fluid is, however, allowed to flow from the peripheral region into the spaces between the respective baffle plates 200, 202, 204 and the lower mesh screens of the matrix modules 72, 74 from the space below the bottom-most matrix module 76 into the lower mesh screen of the bottom-most matrix module 76, and from the space between the respective baffle plates 200, 202, 204 and the upper mesh screens of the matrix modules 70, 72, 74 into the central cavity 78.

Thus, fluid flows from the inlet port 28 to the space below the bottom-most matrix module 76 and then some of the fluid flows upwardly through the lower mesh screen of the bottom-most matrix module 76, while the remainder of the fluid flows into the peripheral region 140. Next the remainder of the fluid flows into the spaces between the respective baffle plates 200, 202, 204 and the lower mesh screens of the remaining matrix modules 70, 72, 74. After passing through the stainless steel wool matrix 88 within each of the matrix modules 70, 72, 74, 76, the respective portions of the fluid flow out through the upper mesh screens of the matrix modules 70, 72, 74, 76 into the space between the upper mesh screens of the matrix modules 70, 72, 74, 76 and the baffle plates 200, 202, 204. From this space between the upper mesh screens of the matrix modules 70, 72, 74, 76, the fluid flows into the central cavity 78 and upwardly, as depicted in FIG. 6, to the outlet port 30.

Advantageously, when used with the separation container 24 of the present embodiment, the above-described materials separation apparatus 10 makes efficient use of the entire volume of separation container 24. Specifically, by providing multiple flow paths for the fluid, e.g., kaolin slurry, each of which flow paths require the fluid to pass through a prescribed volume of the stainless steel wool matrix 88, the present embodiment assures that all of the fluid passes through the prescribed volume of stainless steel wool matrix 88 but does not require that the fluid pass through a matrix having a height equal to or close to the height of the separation container 24. As mentioned above, this is advantageous for at least two reasons: (1) because the paramagnetic impurities tend to accumulate to the first available "clean" steel wool fibers, most of the separation occurs incrementally through the matrix's height and passing the slurry through a matrix of a height greater than several centimeters merely passes impure clay through steel wool already having accumulated impurities or passes clean clay through "clean" steel wool and may not provide an advantage to the user of the material separation apparatus; (2) because more "surface area" is available for slurry to pass into and out of the matrix than would be available if the matrix simply filled the separation container, more slurry can be processed with the present embodiment than with a design in which the matrix simply filled the separation container 24.

Figure 7:
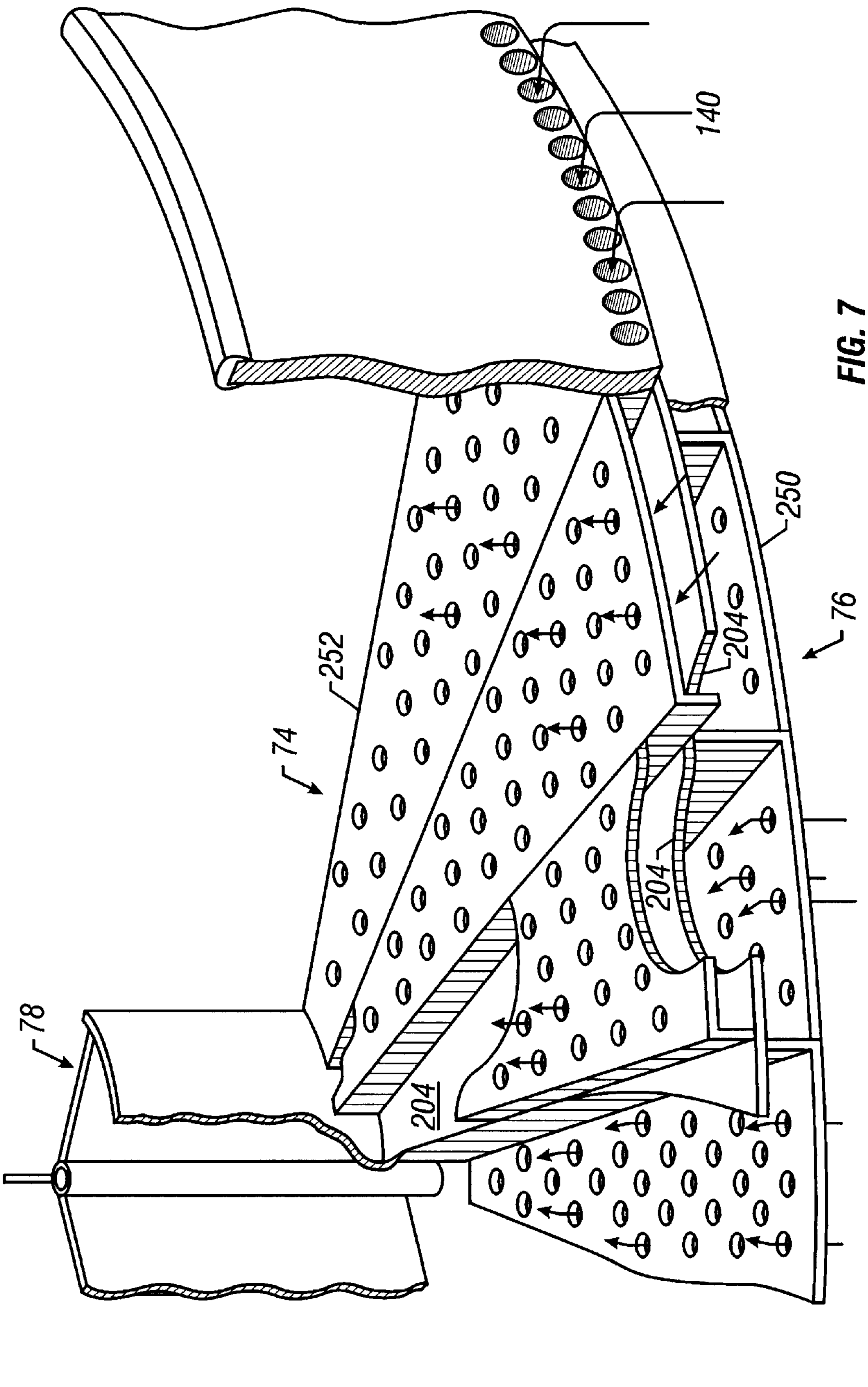
FIG. 7 is a perspective view, partially in section, of the separation container depicted in FIG. 6.

Referring next to FIG. 7, a perspective view, partially in section, is shown of the further embodiment of the separation chamber of FIG. 6. Seen are portions of two of the matrix modules 74, 76, the upper mesh screen 250 of one 76, and the lower mesh screen 252 of the other 74, a portion of the central cavity 78, portions of the inner and outer circumferential surfaces 114, 116 of one of the matrix modules 74, a portion of the baffle plate 204, and arrows indicating the pattern of radial flow of the fluid from the peripheral region 140 into the space between the baffle plate 204 and the lower mesh screen of one of the matrix modules 74; and flowing through such space into such matrix module 74 through the lower mesh screen of such matrix module 74. Also shown with arrows is fluid radially flowing from the bottom-most matrix module 76 through the upper mesh screen 250 of the bottom-most matrix module 76 into the space between the upper mesh screen 250 of the bottom-most matrix module 76 and the baffle plate 204. Such fluid is depicted as flowing toward the central cavity 78 into which it flows before flowing into the outlet port (not shown in FIG. 7).

The matrix modules, in accordance with the present invention, can be configured in a wide variety of sizes, depths, and flow paths. For example, the number of modules in FIG. 6 can be increased from four to seven by reducing each matrix's height from 8 inches to 4 inches. Further, the matrix modules can be configured as removable canisters that, in combination with the removable section 27, can be changed in about one hour providing increased processing flexibility and potentially resulting in dramatic increases in system throughput.

While the invention herein disclosed has been described by means of specific embodiments and applications thereof, numerous modifications and variations could be made thereto by those skilled in the art without departing from the scope of the invention.

What is claimed is:

1. A method of designing and manufacturing an separation apparatus for separating a magnetic component from a non-magnetic component in a slurry, the method comprising:

designing a pulsed superconducting coil for begirding a separation container and for generating a magnetic field that passes through the separation container, the designing including:

selecting a diameter for the superconducting coil, and selecting a height for the superconducting coil, the selecting of the diameter and the selecting of the height including selecting the height and the diameter based on at least one parameter selected from a group of parameters consisting of maximizing the volumetric capacity of the separation container to process the slurry using a prescribed magnetic flux density, minimizing the volume of an iron casing needed to at least partially envelop the pulsed superconducting coil and to provide a flux return path for the magnetic field for a prescribed separation container volume, minimizing the footprint of the separation apparatus for a prescribed separation container volume and a prescribed magnetic field strength within the separation container, and minimizing the magnetic field strength needed to achieve material separation at a prescribed rate in a prescribed separation container volume;

manufacturing the superconducting coil having the diameter and the height, having been selected.

2. The method of claim 1 including:

enveloping the pulsed superconducting coil in an iron casing including a removable portion of the casing that resides above said separation container, the removable portion being held in place during operation of the superconducting coil by a magnetic field emanating from the superconducting coil.

3. The method of claim 1 including:

constructing said separation container including:

forming a plurality of seals between a plurality of matrix modules so that a predetermined flow path through the plurality of matrix modules is effected whereby fluid flowing into said separation container follows the predetermined flow path through the plurality of matrix modules; and inserting the plurality of matrix modules into said separation container.

4. The method of claim 3 including:

inserting a matrix of steel wool into each of said plurality of matrix modules.

5. The method of claim 3 including:

selecting said predetermined flow path so that all of said fluid flows through each of said plurality of matrix modules.

6. The method of claim 3 including:

selecting said predetermined flow path so that each of a plurality of portions of said fluid flows respectively through only one of said plurality of matrix modules.

7. The method of claim 1 wherein said selecting of said diameter and said height includes:

selecting said diameter for said superconducting coil from between 50 centimeters and 250 centimeters; and selecting said height for said superconducting coil from between 75 centimeters and 250 centimeters;

said selecting of said diameter and said selecting of said height being so as to accommodate said desired treatment volume, within at least a portion of said separation container that is begirded by said superconducting coil, and said volume having a diameter-to-height ratio between 3:1 and 1:2.

8. The method of claim 1, wherein the selecting of the diameter and the selecting of the height includes maximizing all four parameters of the group of parameters.

9. The method of claim 2, wherein the selecting of the diameter and the selecting of the height results in the prescribed separation container volume having a diameter of about 152 centimeters (60 inches) and a height of about 102 centimeters (40 inches).

10. A method of manufacturing an apparatus for separating a magnetic component from a nonmagnetic component in a slurry, the method comprising:

selecting a desired treatment volume for a separation container;

designing a superconducting coil for begirding the separation container and for generating a magnetic field that passes through the separation container, the designing comprising:

selecting a diameter for the superconducting coil of from between 100 centimeters and 250 centimeters;

selecting a height for the superconducting coil of from between 75 centimeters and 250 centimeters;

the selecting of the diameter and the selecting of the height being so as to accommodate the desired treatment volume within at least a portion of the separation container that is begirded by the superconducting coil;

manufacturing the separation container having the desired treatment volume; and manufacturing the superconducting coil having the diameter and the height.

11. The method of claim 10 including:

enveloping the pulsed superconducting coil in an iron casing including a removable portion of the casing that resides above said separation container, and the removable portion being held in place during operation of the superconducting coil by a magnetic field emanating from the superconducting coil.

12. The method of claim 10 including:

constructing said separation container including:

forming a plurality of seals between a plurality of matrix modules so that a predetermined flow path is effected whereby fluid flowing into said separation container follows the predetermined flow path through the matrix modules; and inserting a plurality of matrix modules into said separation container.

13. The method of claim 12 including:

inserting a matrix of steel wool into each of said plurality of matrix modules.

14. The method of claim 12 including:

selecting said predetermined flow path so that all of said fluid flows through each of said plurality of matrix modules.

15. The method of claim 12 including:

selecting said predetermined flow path so that each of a plurality of portions of said fluid flows through only one of said matrix modules.

16. The method of claim 10 wherein said manufacturing of said separation container includes:

constructing of said separation container including defining a predetermined flow path wherein said fluid flowing into said separation container follows the predetermined flow path through the separation container, wherein said predetermined flow path assures that each of a plurality of portions of said fluid flow through a prescribed volume of a matrix, wherein the prescribed volume of the matrix is less than half a volume of said separation container.

17. The method of claim 10 wherein said designing of said superconducting coil includes:

selecting said diameter for said superconducting coil of about 110 centimeters; and selecting said height for said superconducting coil of about 160 centimeters.

* * * * *